United States Patent
Tazoe

(10) Patent No.: US 9,786,717 B2
(45) Date of Patent: Oct. 10, 2017

(54) METHOD OF MANUFACTURING PHOTOELECTRIC CONVERSION DEVICE

(71) Applicant: CANON KABUSHIKI KAISHA, Tokyo (JP)

(72) Inventor: Koichi Tazoe, Sagamihara (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/095,486

(22) Filed: Apr. 11, 2016

(65) Prior Publication Data
US 2016/0315116 A1   Oct. 27, 2016

(30) Foreign Application Priority Data

Apr. 22, 2015   (JP) ................. 2015-087784

(51) Int. Cl.
| | |
|---|---|
| *H01L 27/146* | (2006.01) |
| *H01L 27/14* | (2006.01) |
| *H01L 27/12* | (2006.01) |

(52) U.S. Cl.
CPC .. *H01L 27/14698* (2013.01); *H01L 27/14607* (2013.01); *H01L 27/14623* (2013.01); *H01L 27/14636* (2013.01); *H01L 27/1462* (2013.01); *H01L 27/1463* (2013.01); *H01L 27/14621* (2013.01); *H01L 27/14627* (2013.01)

(58) Field of Classification Search
CPC .......... H01L 27/14698; H01L 27/1462; H01L 27/14623; H01L 27/14643; H01L 27/14636
USPC ................... 438/58; 257/432, 435
See application file for complete search history.

(56) References Cited

U.S. PATENT DOCUMENTS

| | | | |
|---|---|---|---|
| 2003/0096438 A1* | 5/2003 | Lee | H01L 27/14643 438/29 |
| 2003/0157754 A1* | 8/2003 | Yamazaki | H01L 27/127 438/162 |
| 2005/0007474 A1 | 1/2005 | Maeda | |
| 2008/0122023 A1* | 5/2008 | Lee | H01L 27/1462 257/443 |

(Continued)

FOREIGN PATENT DOCUMENTS

| | | |
|---|---|---|
| JP | 8-236534 A | 9/1996 |
| JP | 2003-188368 A | 7/2003 |

*Primary Examiner* — Moazzam Hossain
*Assistant Examiner* — Omar Mojaddedi
(74) *Attorney, Agent, or Firm* — Fitzpatrick, Cella, Harper & Scinto

(57) ABSTRACT

A method of manufacturing a photoelectric conversion device includes forming a wiring structure above a semiconductor substrate including a photoelectric converter, forming, by a plasma CVD method, a first insulating film which contains hydrogen, above an uppermost wiring layer in the wiring structure, performing, after formation of the first insulating film, first annealing in a hydrogen containing atmosphere on a structure including the semiconductor substrate, the wiring structure, and the first insulating film, forming a second insulating film above the first insulating film after the first annealing, and performing, after formation of the second insulating film, second annealing in the hydrogen containing atmosphere on a structure including the semiconductor substrate, the wiring structure, the first insulating film, and the second insulating film.

7 Claims, 4 Drawing Sheets

(56) References Cited

U.S. PATENT DOCUMENTS

| | | |
|---|---|---|
| 2009/0004770 A1 | 1/2009 | Park |
| 2009/0159942 A1* | 6/2009 | Song .................. H01L 27/1464 257/292 |
| 2009/0209058 A1* | 8/2009 | Kim .................. H01L 27/14623 438/73 |
| 2011/0037038 A1* | 2/2011 | Kwon .................. C08F 220/14 252/586 |
| 2011/0237014 A1* | 9/2011 | Hiyama ............ H01L 27/14601 438/60 |

* cited by examiner

METHOD OF MANUFACTURING PHOTOELECTRIC CONVERSION DEVICE

BACKGROUND OF THE INVENTION

Field of the Invention

The present invention relates to a method of manufacturing a photoelectric conversion device.

Description of the Related Art

Japanese Patent Laid-Open No. 8-236534 discloses a technique of forming a plasma nitride film without performing an $H_2$ sinter process after forming the uppermost layer Al wiring, and then performing annealing. Japanese Patent Laid-Open No. 8-236534 also discloses a technique of forming a plasma oxide film without performing the $H_2$ sinter process after forming the uppermost layer Al wiring, then further forming a plasma nitride film by applying SOG, and performing annealing after that. Japanese Patent Laid-Open No. 8-236534 further discloses a technique of performing the $H_2$ sinter process after forming the uppermost layer Al wiring, and performing annealing after forming a PSG film and a plasma nitride film sequentially. Note that Japanese Patent Laid-Open No. 8-236534 is not directed to the manufacture of a photoelectric conversion device or a solid-state image sensor.

In a field of the photoelectric conversion device such as a CMOS image sensor or a CCD image sensor, various efforts are being made to reduce a dark output (dark current). The dark output is a signal generated even though the photoelectric conversion device is not exposed to light.

As a method of reducing the dark output, for example, a method of forming a silicon nitride film after forming the uppermost wiring layer, and then performing annealing in a hydrogen containing atmosphere or a method of performing annealing in the hydrogen containing atmosphere after forming the uppermost wiring layer and before forming an insulating film such as a silicon oxide film is considered. However, such a method is insufficient to reduce the dark output.

SUMMARY OF THE INVENTION

The present invention provides a technique more advantageous in reducing a dark output of a photoelectric conversion device.

One of aspects of the present invention provides a method of manufacturing a photoelectric conversion device, the method comprising: forming a wiring structure above a semiconductor substrate including a photoelectric converter; forming, by a plasma CVD method, a first insulating film which contains hydrogen, above an uppermost wiring layer in the wiring structure; performing, after formation of the first insulating film, first annealing in a hydrogen containing atmosphere on a structure including the semiconductor substrate, the wiring structure, and the first insulating film; forming a second insulating film above the first insulating film after the first annealing; and performing, after formation of the second insulating film, second annealing in the hydrogen containing atmosphere on a structure including the semiconductor substrate, the wiring structure, the first insulating film, and the second insulating film.

Further features of the present invention will become apparent from the following description of exemplary embodiments with reference to the attached drawings.

DESCRIPTION OF THE EMBODIMENTS

Exemplary embodiments of the present invention will be described below with reference to the accompanying drawings.

Figure 1:
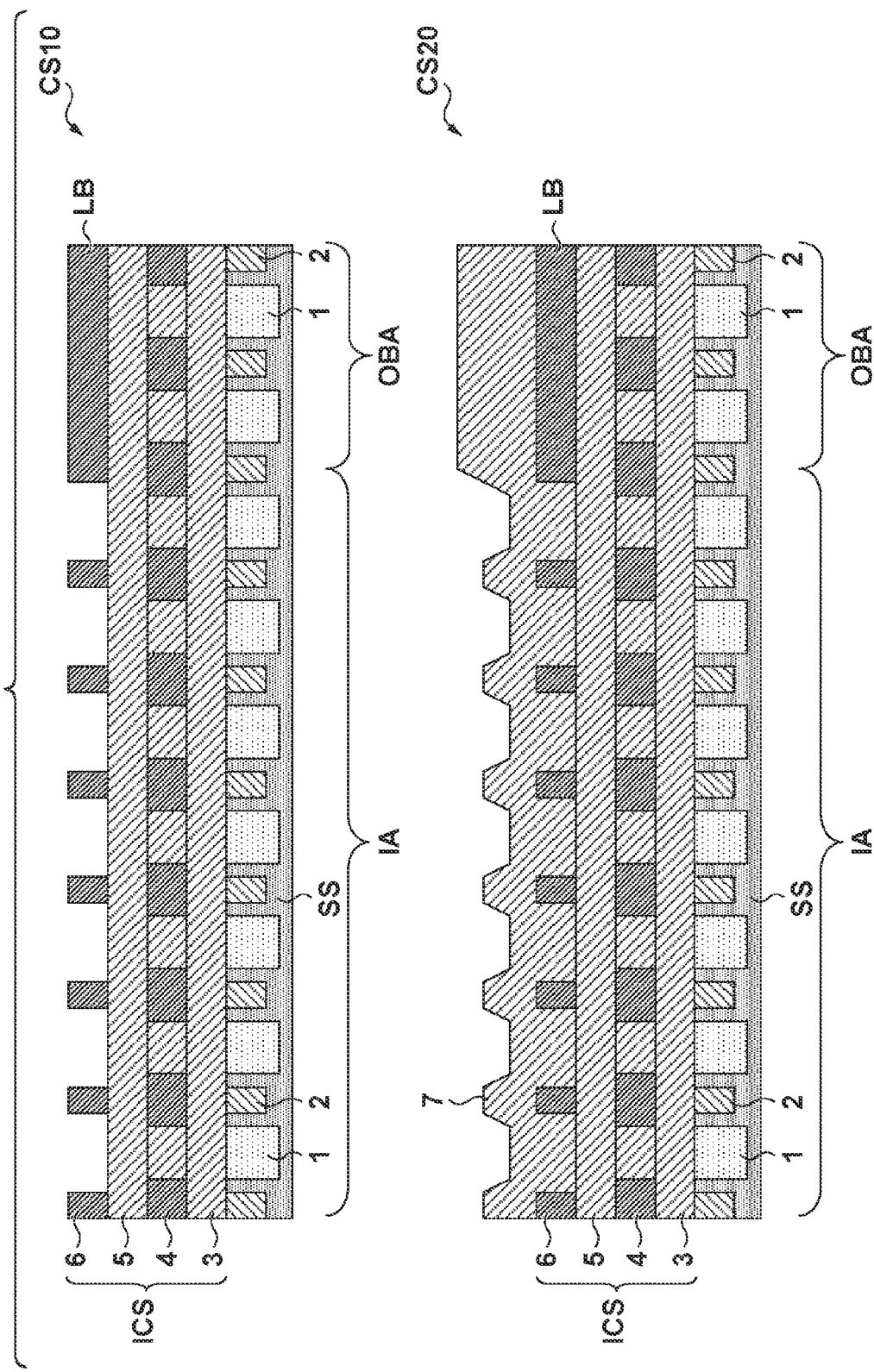
FIG. 1 schematically shows views each showing the sectional structure of a photoelectric conversion device being manufactured.
Figure 2:
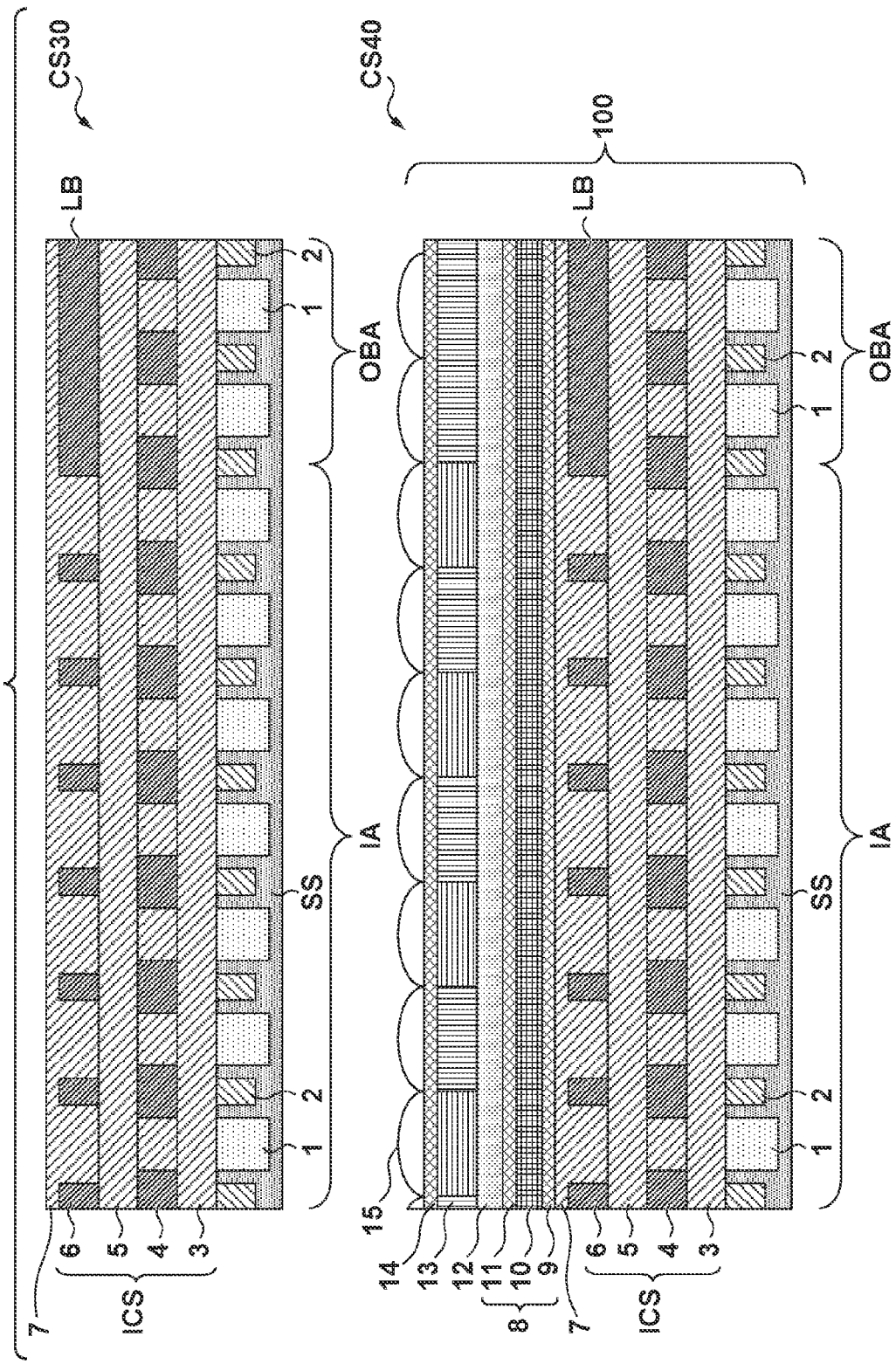
FIG. 2 schematically shows views of the sectional structures of the photoelectric conversion device being manufactured and the completed photoelectric conversion device.

FIGS. 1 and 2 schematically show the sectional structures of a photoelectric conversion device 100 being manufactured and the completed photoelectric conversion device 100. First, the arrangement of the photoelectric conversion device 100 will be described with reference to a sectional view CS40 in FIG. 2. The photoelectric conversion device 100 can be configured as a device including at least one photoelectric converter 1. The photoelectric conversion device 100 can typically be configured as a solid-state image sensor (image sensor) such as an MOS image sensor or a CCD image sensor, or as a linear sensor.

The photoelectric conversion device 100 configured as the solid-state image sensor can include an imaging area IA and an optical black area (to be referred to as an "OB area" hereinafter) OBA. The imaging area IA is an area where an optical image formed by an optical system (not shown) in the photoelectric conversion device 100 is detected as an electrical image signal and includes the plurality of photoelectric converters (first photoelectric converters) 1. Light enters the photoelectric converters 1 in the imaging area IA. The OB area OBA is an area for generating a reference signal indicating an optical black level and includes one or the plurality of photoelectric converters (second photoelectric converters) 1. The photoelectric converters 1 in the OB area OBA are shielded by a light-shielding portion LB from light, and thus do not receive any light.

The photoelectric conversion device 100 includes a semiconductor substrate SS such as a silicon substrate. The plurality of photoelectric converters (first photoelectric converters) 1 of the imaging area IA and one or the plurality of photoelectric converters (second photoelectric converters) 1 of the OB area OBA are formed in the semiconductor substrate SS. Element isolations 2 which isolate elements such as the photoelectric converters 1 from each other are arranged in the semiconductor substrate SS. The photoelectric conversion device 100 can include a wiring structure ICS arranged on the semiconductor substrate SS, a first insulating film 7 arranged on the wiring structure ICS, and an antireflection film 8 arranged on the first insulating film 7. The photoelectric conversion device 100 can further include, on the antireflection film 8, all or some of a planarizing film 12, a color filter array 13, a planarizing film 14, and a microlens array 15. The color filter array 13 is constituted by a plurality of color filters. The microlens array 15 is constituted by a plurality of microlenses.

The wiring structure ICS can include at least one wiring layer (wiring pattern) and at least one interlayer insulating film. The wiring structure ICS can include, for example, a first interlayer insulating film 3, a first wiring layer 4 arranged on the first interlayer insulating film 3, a second interlayer insulating film 5 arranged on the first wiring layer 4, and a second wiring layer 6 arranged on the second interlayer insulating film 5. The wiring structure ICS may further include more wiring layers and interlayer insulating films. In an example shown in FIGS. 1 and 2, the wiring structure ICS includes the first wiring layer 4 and the second wiring layer 6 which is the uppermost wiring layer. At least one wiring layer of the wiring layers including the first wiring layer 4 and the second wiring layer 6 can include the light-shielding portion LB. In one example, the second wiring layer 6 as the uppermost wiring layer can include the light-shielding portion LB.

The first insulating film 7 is a hydrogen containing film and can be formed by the plasma CVD method. The first insulating film 7 can be, for example, a silicon oxide film formed by the plasma CVD method. The antireflection film 8 is a film including a second insulating film 10. That is, the second insulating film 10 can constitute a part of the antireflection film 8. The second insulating film 10 can be, for example, a silicon nitride film. The silicon nitride film serving as the second insulating film 10 can be formed by, for example, the plasma CVD method. The antireflection film 8 can include, for example, a first silicon oxynitride film 9 and a second silicon oxynitride film 11, in addition to the second insulating film 10. The first silicon oxynitride film 9 and the second silicon oxynitride film 11 can be arranged so as to sandwich the second insulating film 10. The first silicon oxynitride film 9 and the second silicon oxynitride film 11 can be formed by, for example, the plasma CVD method.

Although not shown, the photoelectric conversion device 100 can include a peripheral circuit such as a readout circuit. When the photoelectric conversion device 100 is configured as a MOS image sensor, the readout circuit can include, for example, a vertical scanning circuit, a horizontal scanning circuit, and an amplification circuit. When the photoelectric conversion device 100 is configured as a CCD image sensor, the readout circuit can include, for example, a vertical transfer CCD provided for each column and a horizontal transfer CCD which performs horizontal transfer of a signal of each row transferred via the vertical transfer CCD. FIGS. 1 and 2 do not show contacts and vias.

Figure 3:
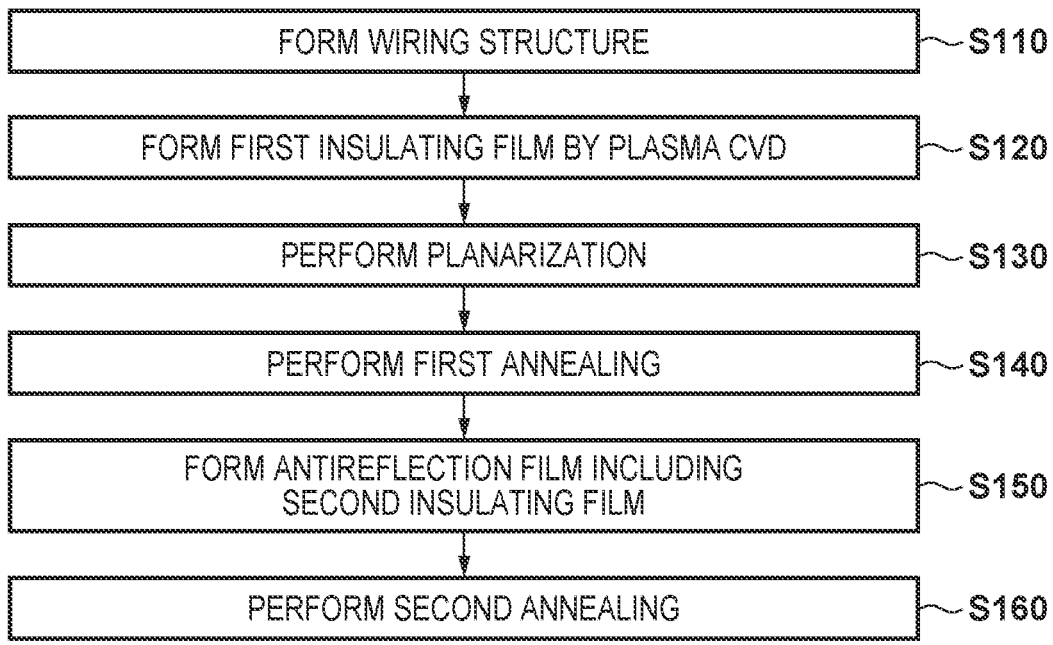
FIG. 3 is a flowchart showing a method of manufacturing the photoelectric conversion device according to the first embodiment of the present invention.

A method of manufacturing the photoelectric conversion device 100 according to the first embodiment of the present invention will be described below with reference to FIGS. 1 to 3. FIG. 3 shows the method of manufacturing the photoelectric conversion device 100 according to the first embodiment of the present invention. In step S110, the wiring structure ICS is formed on the semiconductor substrate SS including the photoelectric converters 1, as schematically shown in a sectional view CS10 of FIG. 1.

The first wiring layer 4 and the second wiring layer 6 as the plurality of wiring layers constituting the wiring structure ICS can be formed by, for example, Al films. More specifically, the first wiring layer 4 or the second wiring layer 6 can be formed by forming, in a photolithography process, a resist pattern on the Al film that has previously been formed and etching the Al film by dry etching.

The first interlayer insulating film 3 as one of the plurality of interlayer insulating films constituting the wiring structure ICS can be formed by, for example, a BPSG/NSG film. The second interlayer insulating film 5 as another one of the plurality of interlayer insulating films constituting the wiring structure ICS can be formed by, for example, the plasma CVD method. A step of forming the wiring structure ICS can be executed at a temperature lower than a temperature in first annealing and a temperature in second annealing to be described later.

Then, in step S120, the first insulating film 7 is formed, by the plasma CVD method, on the second wiring layer 6 as the uppermost wiring layer in the wiring structure ICS, as schematically shown in a sectional view CS20 of FIG. 1. The first insulating film 7 is the hydrogen containing film. The first insulating film 7 is, for example, the silicon oxide film formed by the plasma CVD method.

A step of forming the first insulating film 7 can include the first step and the subsequent second step. In the first step, the silicon oxide film is formed, for example, by a high-density plasma CVD method under the following conditions 1.

<Conditions 1>

$SiH_4$ flow rate: a range of 100 to 140 sccm, such as 120 sccm $O_2$ flow rate: a range of 160 to 170 sccm, such as 166 sccm Ar flow rate: a range of 220 to 260 sccm, such as 240 sccm deposition temperature: a range of 300° C. to 340° C., such as 330° C.

In the second step, the silicon oxide film is formed, for example, by the plasma CVD method under the following conditions 2.

<Conditions 2>

TEOS supply amount: a range of 1,800 to 2,200 mg/min, such as 2,000 mg/min $O_2$ flow rate: a range of 1,800 to 2,200 sccm, such as 2,000 sccm RF power: a range of 710 to 750 W, such as 730 W deposition temperature: a range of 390° C. to 410° C., such as 400° C.

In the step of forming the first insulating film 7 by the plasma CVD method, defects may be formed in the photoelectric converters 1 by ultraviolet light generated by a plasma for CVD. Note that the light-shielding portion LB covers the photoelectric converters (second photoelectric converters) 1 in the OB area OBA. Therefore, the defects formed by the ultraviolet light are few in number in the photoelectric converters (second photoelectric converters) 1 of the OB area OBA. On the other hand, ultraviolet light enters the photoelectric converters (first photoelectric converters) 1 in the imaging area IA via openings provided in the wiring layers 4 and 6. Therefore, the defects formed by the ultraviolet light are larger in number in the photoelectric converters (first photoelectric converters) 1 of the imaging area IA than in the photoelectric converters (second photoelectric converters) 1 of the OB area OBA.

Then, in step S130, the first insulating film 7 is planarized by the CMP (Chemical Mechanical Polishing) method, as schematically shown in a sectional view CS30 of FIG. 2. This CMP can be performed, for example, by using silica slurry, at a pressure of 400 hPa and room temperature. The surface unevenness of the first insulating film 7 may be reduced by plasma dry etching or the like prior to CMP.

Then, in step S140, the first annealing is performed on a structure including the semiconductor substrate SS, the wiring structure ICS, and the first insulating film 7 in a hydrogen containing atmosphere. The first annealing can be performed, for example, under the following conditions 3. Heating can be performed by, for example, heater heating with a batch furnace. A boat-in/out temperature is, for example, 350° C.

<Conditions 3> temperature: 400° C.

time: 30 min hydrogen concentration: a range of 10% to 100%, such as a range of 50% to 1,000%

The first annealing can be performed so as to repair the defects formed in the photoelectric converters (first photoelectric converters) 1 of the imaging area IA when forming the first insulating film 7. More specifically, hydrogen present in the first insulating film 7 as the hydrogen containing film is diffused by the first annealing. This diffusion includes diffusion in a direction toward the surface of the semiconductor substrate SS (the interface between the semiconductor substrate SS and the interlayer insulating film 3 thereon or a silicon oxide film (not shown)), and diffusion (outer diffusion) in a direction away from the semiconductor substrate SS. The hydrogen that has moved to the surface of the semiconductor substrate SS by the diffusion terminates a dangling bond at the Si—$SiO_2$ interface. This reduces the dark outputs of the photoelectric converters 1. The first annealing also contributes to sintering of the wiring layers 4 and 6. With this sintering, reliability of the wiring layers 4 and 6 can be improved.

Then, in step S150, the antireflection film 8 including the second insulating film 10 is formed by the plasma CVD method. Note that only the second insulating film 10 may be formed when the antireflection film 8 is not needed. In one example, the antireflection film 8 can include the first silicon oxynitride film 9, the second insulating film 10, and the second silicon oxynitride film 11. The second insulating film 10 can be, for example, the silicon nitride film.

The first silicon oxynitride film 9 can be formed, for example, by the plasma CVD method under the following conditions 4.

<Conditions 4>

$SiH_4$ flow rate: a range of 230 to 270 sccm, such as 250 sccm $N_2O$ flow rate: a range of 1,500 to 1,900 sccm, such as 1,700 sccm $NH_3$ flow rate: a range of 3,000 to 3,400 sccm, such as 3,200 sccm RF power: a range of 330 to 370 W, such as 350 W pressure: a range of 1.5 to 1.9 Torr, such as 1.7 Torr temperature: 380° C. to 420° C., such as 400° C.

The silicon nitride film as an example of the second insulating film 10 can be formed, for example, by the plasma CVD method under the following conditions 5.

<Conditions 5>

$SiH_4$ flow rate: a range of 190 to 240 sccm, in particular 215 sccm $NH_3$ flow rate: a range of 50 to 90 sccm, in particular 70 sccm RF power: a range of 540 to 580 W, such as 560 W pressure: a range of 4.3 to 4.7 Torr, such as 4.5 Torr temperature: 380° C. to 420° C., such as 400° C.

The second silicon oxynitride film 11 can be formed, for example, by the plasma CVD method under the following conditions 6.

<Conditions 6>

$SiH_4$ flow rate: the range of 230 to 270 sccm, such as 250 sccm $N_2O$ flow rate: the range of 1,500 to 1,900 sccm, such as 1,700 sccm $NH_3$ flow rate: the range of 3,000 to 3,400 sccm, such as 3,200 sccm RF power: a range of 630 to 670 W, such as 650 W pressure: the range of 1.5 to 1.9 Torr, such as 1.7 Torr temperature: 380° C. to 420° C., such as 400° C.

Then, in step S160, the second annealing is performed on a structure including the semiconductor substrate SS, the wiring structure ICS, the first insulating film 7, and the antireflection film 8 (including the second insulating film 10) in a hydrogen containing atmosphere. The second annealing can be performed, for example, under the following conditions 7. Heating can be performed by, for example, heater heating with the batch furnace. The boat-in/out temperature is, for example, 350° C.

<Conditions 7> temperature: 425° C.

time: 2 hrs hydrogen concentration: the range of 10% to 100%, such as the range of 50% to 1,000%

The temperature of the first annealing in step S140 can be set lower than that of the second annealing in step S160. Further, the time of the first annealing in step S140 can be set shorter than that of the second annealing in step S160.

After that, the planarizing film 12, the color filter array 13, the planarizing film 14, and the microlens array 15 can be formed on the antireflection film 8 in this order. The planarizing film 12, the color filter array 13, the planarizing film 14, and the microlens array 15 can be made of resins on the antireflection film 8.

In the first embodiment, the first annealing (step S140) is executed between the step (step S150) of forming the second insulating film 10 and the step (step S120) of forming the first insulating film 7 containing the hydrogen by the plasma CVD method, as described above. With this first annealing, the defects formed in the photoelectric converters 1 by the ultraviolet light generated by the plasma in the step of forming the first insulating film 7 are repaired. In first embodiment, the first annealing (step S140) is executed after planarization (step S130) of the first insulating film 7.

When the photoelectric conversion device 100 includes the OB area OBA, the dark outputs of the photoelectric converters (first photoelectric converters) 1 in the imaging area IA can be larger than those of the photoelectric converters (second photoelectric converters) 1 in the OB area OBA. This reason will be described as follows. When the first insulating film 7 is formed, the photoelectric converters 1 in the imaging area IA are irradiated with the ultraviolet light from the plasma via the openings formed in the wiring layers 4 and 6. Consequently, the defects are formed. On the other hand, the photoelectric converters 1 in the OB area OBA are not irradiated with ultraviolet light because the light-shielding portion LB shields it from light. Hence, the number of detects generated in the photoelectric converters 1 of the imaging area IA when forming the first insulating film 7 by the plasma CVD method can be larger than that of the OB area OBA.

According to the first embodiment, however, the first annealing is executed in the hydrogen containing atmosphere after forming the first insulating film 7 and before forming the second insulating film 10, making it possible to repair the detects of the photoelectric converters 1 in the imaging area IA. As a result, the dark outputs of the photoelectric converters 1 in the imaging area IA are reduced, making it possible to bring the dark outputs of the photoelectric converters 1 in the imaging area IA and those in the OB area OBA closer to each other.

In the first embodiment, the second annealing can also reduce the dark outputs of the photoelectric converters 1 in the imaging area IA. Note that the second insulating film 10 is preferably, though may not be, the silicon nitride film. The first insulating film 7 which contains the hydrogen is a film having a high hydrogen supplying capacity. On the other hand, if the second insulating film 10 is the silicon nitride film, it is an insulating film with low permeability. In this case, in the second annealing, the second insulating film 10 functions as a film which prevents outer diffusion of the hydrogen. This increases the amount of hydrogen supplied to the interface of the semiconductor substrate SS. As a result, the defects of the photoelectric converters 1 in the imaging area IA can be repaired efficiently.

Figure 5:
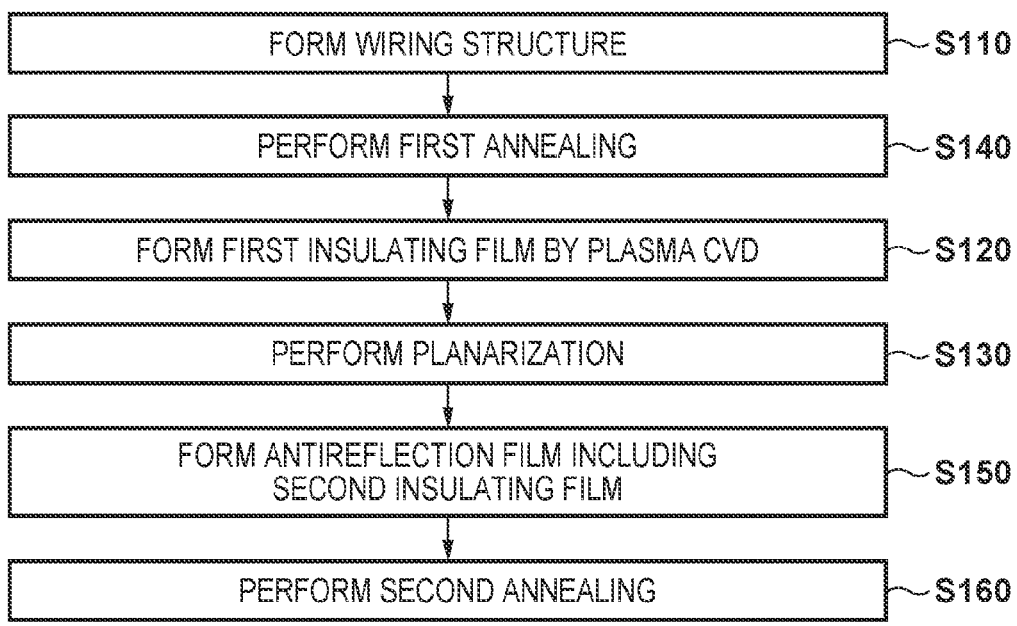
FIG. 5 is a flowchart showing a manufacturing method in a comparative example.

FIG. 5 shows a method of manufacturing the photoelectric conversion device 100 as a comparative example. In the comparative example, the first annealing (step S140) in the first embodiment is executed between formation (step S110) of the wiring structure and formation (step S120) of the first insulating film 7. Note that steps S110 to S160 in FIG. 5 (comparative example) correspond to steps S110 to S160 in FIG. 3 (first embodiment). However, the order of steps is different between the first embodiment and the comparative example.

When the first annealing (step S140) is executed between the formation (step S110) of the wiring structure and the formation (step S120) of the first insulating film 7, the defects formed in the photoelectric converters 1 in the formation (step S120) of the first insulating film 7 are not repaired by executing the first annealing (step S140).

Figure 4:
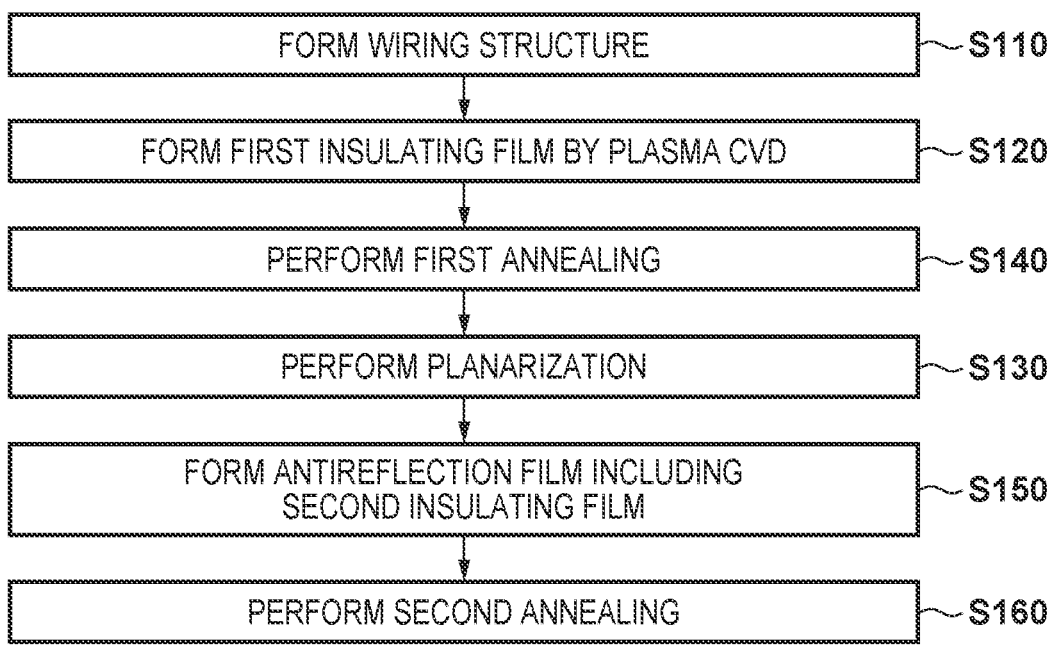
FIG. 4 is a flowchart showing a method of manufacturing a photoelectric conversion device according to the second embodiment of the present invention.

FIG. 4 shows a method of manufacturing a photoelectric conversion device 100 according to the second embodiment of the present invention. Note that steps S110 to S160 in FIG. 4 (second embodiment) correspond to steps S110 to S160 in FIG. 3 (first embodiment). However, the order of steps is different between the first embodiment and the second embodiment. More specifically, while the planarization (step S130) of the first insulating film 7 is executed before the first annealing (step S140) in the first embodiment, planarization (step S130) of a first insulating film 7 is executed after first annealing (step S140) in the second embodiment.

In the second embodiment, the first annealing (step S140) is executed before the volume of the first insulating film 7 which contains hydrogen is decreased through the planarization (step S130). This is considered advantageous in supplying the hydrogen to the photoelectric converters 1 in the first annealing.

Figure 6:
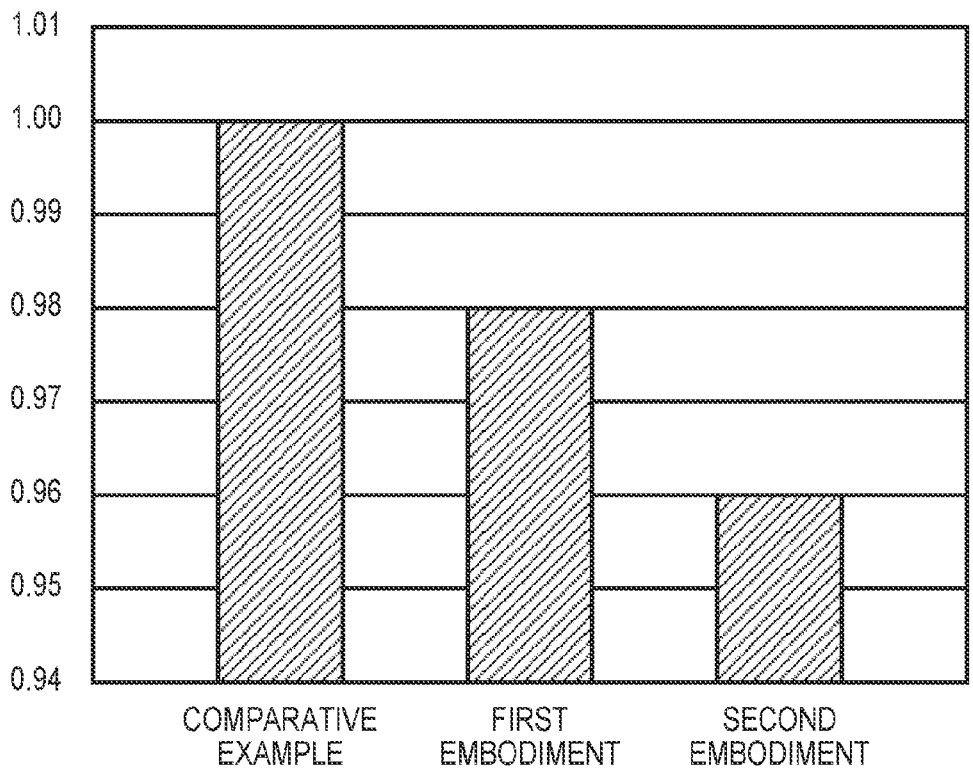
FIG. 6 is a graph showing comparison of dark outputs in the first embodiment, the second embodiment, and the comparative example.

FIG. 6 shows an evaluation result of the dark outputs of the photoelectric converters 1 in the imaging area IA of the photoelectric conversion device 100 manufactured in accordance with the first embodiment (FIG. 3), the second embodiment (FIG. 4), and the comparative example (FIG. 5), respectively. Referring to FIG. 6, the dark outputs of the photoelectric conversion device manufactured in accordance with the first and second embodiments are normalized by the dark outputs of the photoelectric conversion device manufactured in the comparative example. As is apparent from FIG. 6, the first embodiment is superior to the comparative example and the second embodiment is further superior to the other two.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-087784, filed Apr. 22, 2015, which is hereby incorporated by reference herein in its entirety.

What is claimed is:

1. A method of manufacturing a photoelectric conversion device, the method comprising:
    forming a wiring structure above a semiconductor substrate including a photoelectric converter;
    forming, by a plasma CVD method, a silicon oxide film which contains hydrogen, above an uppermost wiring layer in the wiring structure;
    planarizing the silicon oxide film;
    performing, after the planarizing, first annealing in a hydrogen containing atmosphere on a structure including the semiconductor substrate, the wiring structure, and the silicon oxide film;
    forming, after the first annealing, an antireflection film above the silicon oxide film, the antireflection film including a first silicon oxynitride film, a silicon nitride film arranged on the first silicon oxynitride film, and a second silicon oxynitride film arranged on the silicon nitride film; and
    performing, after the forming of the antireflection film, second annealing in the hydrogen containing atmosphere on a structure including the semiconductor substrate, the wiring structure, the silicon oxide film, and the antireflection film,
    wherein a temperature of the first annealing is lower than that of the second annealing, and
    wherein a time of the first annealing is shorter than that of the second annealing.

2. The method according to claim 1, wherein the silicon nitride film is formed by a plasma CVD method.

3. The method according to claim 1, wherein the semiconductor substrate includes a plurality of photoelectric converters including the photoelectric converter, and the plurality of photoelectric converters include a first photoelectric converter arranged in an imaging area and a second photoelectric converter arranged in an optical black area,
    wherein the wiring structure includes a light-shielding portion configured to shield the second photoelectric converter from light, and
    wherein the first annealing is performed so as to repair a defect formed in the first photoelectric converter by ultraviolet light generated by a plasma by which the silicon oxide film is formed.

4. The method according to claim 1, wherein the wiring structure includes a plurality of wiring layers, and
    wherein the forming of the wiring structure is executed at a temperature lower than a temperature of the first annealing and a temperature of the second annealing.

5. The method according to claim 1, wherein the uppermost wiring layer contains aluminum.

6. The method according to claim 1, wherein the wiring structure includes at least a first wiring layer, a second wiring layer arranged above the first wiring layer, and an interlayer insulating film arranged between the first wiring layer and the second wiring layer, and
    wherein the forming of the silicon oxide film is performed after the forming of the wiring structure.

7. The method according to claim 1, wherein, in the forming of the antireflection film, the first silicon oxynitride film, the silicon nitride film, and the second silicon oxynitride film are formed by a plasma CVD method.

* * * * *